(12) United States Patent
Kim et al.

(10) Patent No.: US 12,245,469 B2
(45) Date of Patent: Mar. 4, 2025

(54) DISPLAY DEVICE HAVING IMPROVED LIGHT EMISSION EFFICIENCY

(71) Applicant: Samsung Display Co., LTD., Yongin-si (KR)

(72) Inventors: Beom Joon Kim, Seoul (KR); Hyo Min Ko, Suwon-si (KR); Sang Gyun Kim, Hwaseong-si (KR); Bo Ra Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 146 days.

(21) Appl. No.: 17/406,068

(22) Filed: Aug. 18, 2021

(65) Prior Publication Data

US 2022/0069043 A1     Mar. 3, 2022

(30) Foreign Application Priority Data

Sep. 1, 2020   (KR) .................. 10-2020-0110971

(51) Int. Cl.
| | |
|---|---|
| *H10K 59/124* | (2023.01) |
| *H10K 59/122* | (2023.01) |
| *H10K 59/123* | (2023.01) |
| H10K 59/12 | (2023.01) |

(52) U.S. Cl.
CPC ......... *H10K 59/124* (2023.02); *H10K 59/122* (2023.02); *H10K 59/123* (2023.02); *H10K 59/1201* (2023.02)

(58) Field of Classification Search
CPC .. H10K 59/124; H10K 59/122; H10K 59/123; H10K 59/1201
USPC ............................................................ 257/40
See application file for complete search history.

(56) References Cited

U.S. PATENT DOCUMENTS

| | | | |
|---|---|---|---|
| 10,680,208 B2 | 6/2020 | Wu et al. | |
| 10,741,627 B2 | 8/2020 | Jung et al. | |
| 2017/0104038 A1 | 4/2017 | Lee et al. | |
| 2018/0033848 A1* | 2/2018 | Jung | H10K 59/124 |
| 2018/0331316 A1* | 11/2018 | Lee | H10K 50/841 |
| 2019/0165318 A1* | 5/2019 | Choi | H10K 59/124 |

FOREIGN PATENT DOCUMENTS

| | | |
|---|---|---|
| JP | 2015133293 A | 7/2015 |
| KR | 1020150077279 A | 7/2015 |
| KR | 1020180014905 A | 2/2018 |
| KR | 1020200025618 A | 3/2020 |

* cited by examiner

*Primary Examiner* — Xia L Cross
(74) *Attorney, Agent, or Firm* — CANTOR COLBURN LLP

(57) ABSTRACT

A display device includes a first substrate on which a thin film transistor is disposed, a planarization layer disposed on the first substrate, where the planarization layer includes a plurality of protrusions, a first electrode disposed on the planarization layer, a pixel defining layer disposed on the first electrode, where the pixel defining layer includes a plurality of insulating patterns corresponding to the protrusions, a light emitting layer disposed on the first electrode and the pixel defining layer, and a second electrode disposed on the light emitting layer.

20 Claims, 18 Drawing Sheets

DISPLAY DEVICE HAVING IMPROVED LIGHT EMISSION EFFICIENCY

This application claims priority to Korean Patent Application No. 10-2020-0110971 filed on Sep. 1, 2020, and all the benefits accruing therefrom under 35 U.S.C. § 119, the content of which in its entirety is herein incorporated by reference.

BACKGROUND

1. Field

The disclosure relates to a display device.

2. Description of the Related Art

The importance of display devices has steadily increased with the development of multimedia technology. Accordingly, various types of display device such as a liquid crystal display ("LCD") device, an organic light emitting diode ("OLED") display device and the like have been widely used in various fields.

Among the various types of display device, a self-light emitting display device includes a self-light emitting element such as an organic light emitting element. The self-light emitting element may include two opposite electrodes and a light emitting layer interposed therebetween. In a self-light emitting display device where the organic light emitting element is used as the self-light emitting element, the electrons and holes from the two electrodes are recombined in the light emitting layer to produce excitons, which transition from the excited state to the ground state, emitting light.

Such a self-light emitting display device is attracting attention as a next-generation display device because of various desired characteristics such as having a wide viewing angle, high brightness and contrast, and quick response speed as well as having a low power consumption, light-weightness, and thinness by not using a power source such as a backlight unit.

SUMMARY

Embodiments of the disclosure provide a display device having improved light emission efficiency by increasing light reflectivity.

In accordant with embodiments of the display device according to the invention, a first electrode having an inclination is formed by a planarization layer including a plurality of protrusions, the light reflectivity of reflecting light emitted from a light emitting layer upward may be increased, thereby increasing light emission efficiency and luminance.

In such embodiments, defects due to concentration of an electric field and non-uniform light emission may be effectively prevented by forming a plurality of insulating patterns on the first electrode overlapping the protrusions.

According to an embodiment of the disclosure, the display device includes a first substrate on which a thin film transistor is disposed, a planarization layer disposed on the first substrate, where the planarization layer includes a plurality of protrusions, a first electrode disposed on the planarization layer, a pixel defining layer disposed on the first electrode, wherein the pixel defining layer includes a plurality of insulating patterns corresponding to the protrusions, a light emitting layer disposed on the first electrode and the pixel defining layer, and a second electrode disposed on the light emitting layer.

In an embodiment, an opening may be defined through the pixel defining layer to expose the first electrode, and the protrusions may overlap the opening.

In an embodiment, the protrusions may be spaced apart from each other, and the planarization layer further includes a flat portion disposed between the protrusions.

In an embodiment, the flat portion may not overlap the insulating patterns.

In an embodiment, the first electrode and the light emitting layer may be in contact with each other in the flat portion, and the light emitting layer and the second electrode may be in contact with each other in the flat portion.

In an embodiment, the protrusions may have a stripe shape or a mesh shape in a plan view.

In an embodiment, the protrusions may have a hemispherical cross section or a polygonal cross section.

In an embodiment, the protrusions may have a dot shape in a plan view, and is the remaining region of the planarization layer on the first electrode except for the protrusions may be the flat portion.

In an embodiment, the protrusions may have a circular shape or a polygonal shape in the plan view.

In an embodiment, a planar area of the protrusions may be equal to or less than a planar area of the flat portion.

In an embodiment, the planar area of the protrusions is in a range of about 40% to about 100% of the planar area of the flat portion.

In an embodiment, the protrusions may overlap the first electrode, the light emitting layer, and the second electrode.

In an embodiment, the insulating patterns may be disposed in the opening, and the insulating patterns may be disposed between the first electrode and the light emitting layer.

According to an embodiment of the disclosure, the display device includes a first substrate including an emission portion and a non-emission portion, a planarization layer disposed on the first substrate, where the planarization layer includes a plurality of protrusions, a first electrode disposed on the planarization layer, a pixel defining layer disposed on the first electrode, where the pixel defining layer includes a plurality of insulating patterns corresponding to the protrusions, a light emitting layer disposed on the first electrode and the pixel defining layer, and a second electrode disposed on the light emitting layer, wherein the first electrode, the protrusions, the insulating patterns, the light emitting layer, and the second electrode overlap the non-emission portion.

In an embodiment, an opening may be defined through the pixel defining layer to expose the first electrode, and the protrusions may include a first protrusion which does not overlap the opening and a second protrusion overlapping the opening.

In an embodiment, the planarization layer may further include a flat portion disposed between the first protrusion and the second protrusion and between the second protrusions, and the flat portion, the first electrode, the light emitting layer and the second electrode may overlap the emission portion.

In an embodiment, the first electrode may be in contact with the light emitting layer in the emission portion, and the first electrode may be in contact with the insulating patterns in the non-emission portion.

In an embodiment, a height of the first protrusion may be equal to a height of the second protrusion.

In an embodiment, a height of the insulating patterns may be equal to a height of the pixel defining layer.

In an embodiment, the display device may further include a thin film transistor disposed on the first substrate, where the thin film transistor may include an active layer, a gate electrode, a source electrode, and a drain electrode.

BRIEF DESCRIPTION OF THE DRAWINGS

The above and other features of the disclosure will become more apparent by describing in detail embodiments thereof with reference to the attached drawings, in which.

DETAILED DESCRIPTION

Figure 1A:
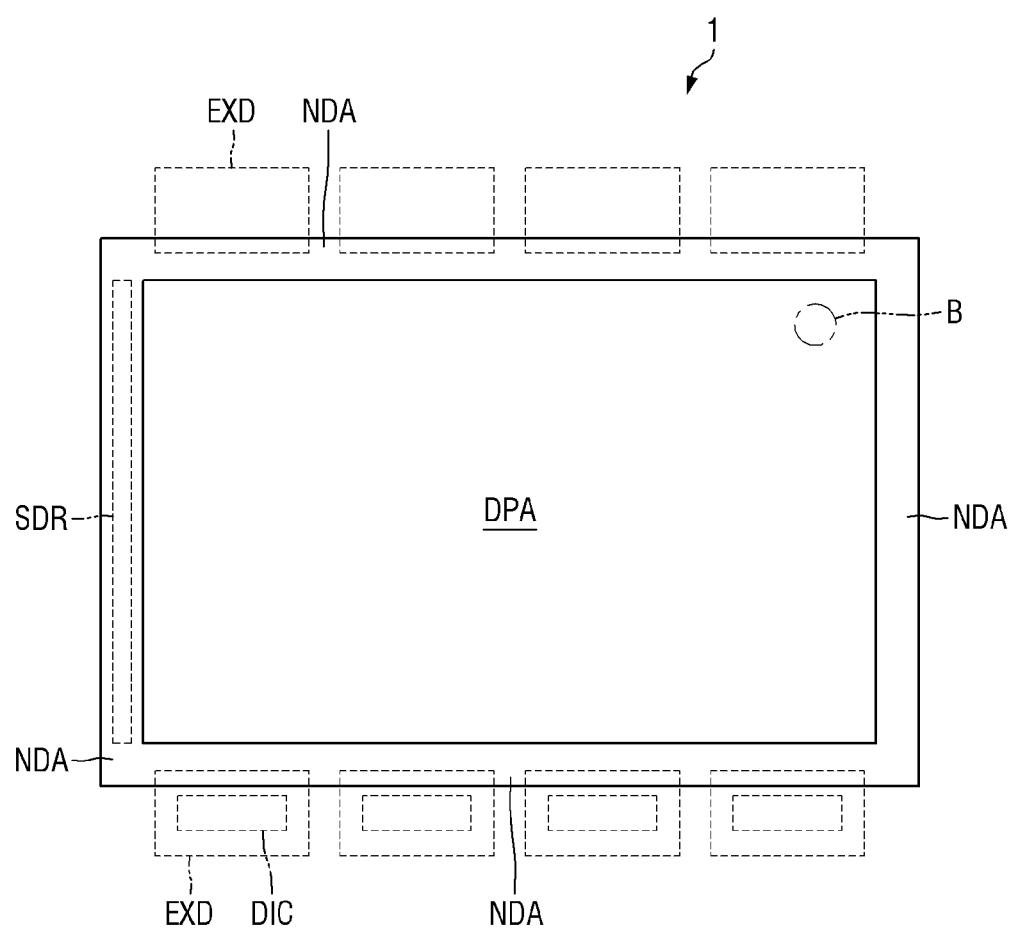
FIG. 1A is a plan view of a display device according to an embodiment.

The invention will now be described more fully hereinafter with reference to the accompanying drawings, in which various embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Each of the features of the various embodiments of the disclosure may be combined or combined with each other, in part or in whole, and technically various interlocking and driving are possible. Each embodiment may be implemented independently of each other or may be implemented together in an association.

Hereinafter, embodiments of the invention will be described in detail with reference to the accompanying drawings.

Figure 1B:
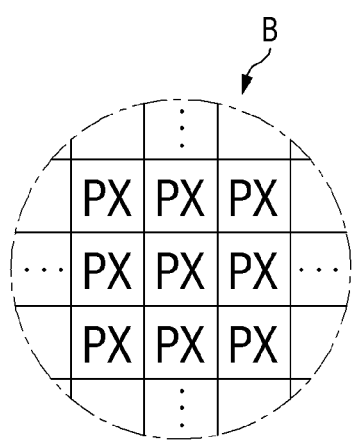
FIG. 1B is an enlarged view of the encircled portion B of FIG. 1A.

FIG. 1A is a plan view of a display device according to an embodiment, and FIG. 1B is an enlarged view of the encircled portion B of FIG. 1A.

Referring to FIG. 1A, an embodiment of a display device 1 may be applied to a smartphone, a mobile phone, a tablet personal computer ("PC"), a personal digital assistant ("PDA"), a portable multimedia player ("PMP"), a television, a game machine, a wristwatch-type electronic device, a head-mounted display, a monitor of a personal computer, a laptop computer, a car navigation system, a car's dashboard, a digital camera, a camcorder, an external billboard, an electronic billboard, a medical device, an inspection device, various household appliances such as a refrigerator and a washing machine, or an Internet-of-Things device. Herein, for convenience of description, embodiments where the display device is a television ("TV") will be described in detail, and the TV may have a high resolution or an ultra-high resolution such as high-definition ("HD"), ultra-high-definition ("UHD"), 4K and 8K.

In such embodiments, the display device 1 may be classified into various types according to a display method. In such embodiments, the display device may include an organic light emitting display ("OLED") device, an inorganic light emitting display ("inorganic EL") device, a quantum dot light emitting display ("QED") device, a micro-light emitting diode ("LED") display device, a nano-LED display device, a plasma display device ("PDP"), a field emission display ("FED") device and a cathode ray tube ("CRT") display device, a liquid crystal display ("LCD") device, an electrophoretic display ("EPD") device, and the like. Hereinafter, for convenience of description, embodiments where the display device is an organic light emitting display device will be described in detail, and the organic light emitting display device applied to the embodiment will be simply referred to as a display device unless the context clearly indicates otherwise. However, the embodiments of the invention are not limited to the organic light emitting display device, and other types of display device described above or known in the art may be applied within the scope of the teachings herein.

An embodiment of the display device 1 may have a square shape, e.g., a rectangular shape in a plan view. In an embodiment where the display device 1 is a television, the display device 1 is disposed in a way such that its long side extends in a horizontal direction. However, the disclosure is not limited thereto, and the long side of the display device 1 may extend in a vertical direction. Alternatively, the display device 1 may be installed to be rotatable such that its long side is variably positioned to extend in the horizontal or vertical direction.

In an embodiment, as shown in FIG. 1A, the display device 1 may include a display area DPA and a non-display area NDA. The display area DPA may be an active area in which an image is displayed. The display area DPA may have a rectangular shape in a plan view similar to the overall shape of the display device 1, but the disclosure is not limited thereto.

In an embodiment, as shown in FIG. 1B, the display area DPA may include a plurality of pixels PX. The plurality of pixels PX may be arranged in a matrix form. The shape of each pixel PX may be rectangular or square in a plan view, but not being limited thereto. Alternatively, each pixel PX may have a rhombic shape of which each side is inclined with respect to one side direction of the display device 1, for example. The pixels PX may include pixels PX of different colors. In one embodiment, for example, the pixels PX may include, a first color pixel PX of red, a second color pixel PX of green, and a third color pixel PX of blue, although not limited thereto. The color pixels PX may be alternately arranged in a stripe type or a pentile type.

The non-display area NDA may be disposed around the display area DPA. The non-display area NDA may completely or partially surround the display area DPA. The display area DPA may have a rectangular shape, and the non-display area NDA may be disposed adjacent to four sides of the display area DPA. The non-display area NDA may correspond to a bezel of the display device 1.

In an embodiment, a driving circuit or a driving element for driving the display area DPA may be disposed in the non-display area NDA. In an embodiment, in a first non-display area NDA disposed adjacent to a first long side (lower side in FIG. 1A) of the display device 1 and a second non-display area NDA disposed adjacent to a second long side (upper side in FIG. 1A) of the display device 1, pad portions may be provided on a display substrate of the display device 1, and external devices EXD may be mounted on pad electrodes of the pad portions. The external devices EXD may include, e.g., a connection film, a printed circuit board, a driver integrated circuit ("DIC"), a connector, a wiring connection film and the like. A scan driver SDR, which may be formed directly on the display substrate of the display device 1, may be provided in a third non-display area NDA disposed adjacent to a first short side (left side in FIG. 1A) of the display device 1.

Figure 2:
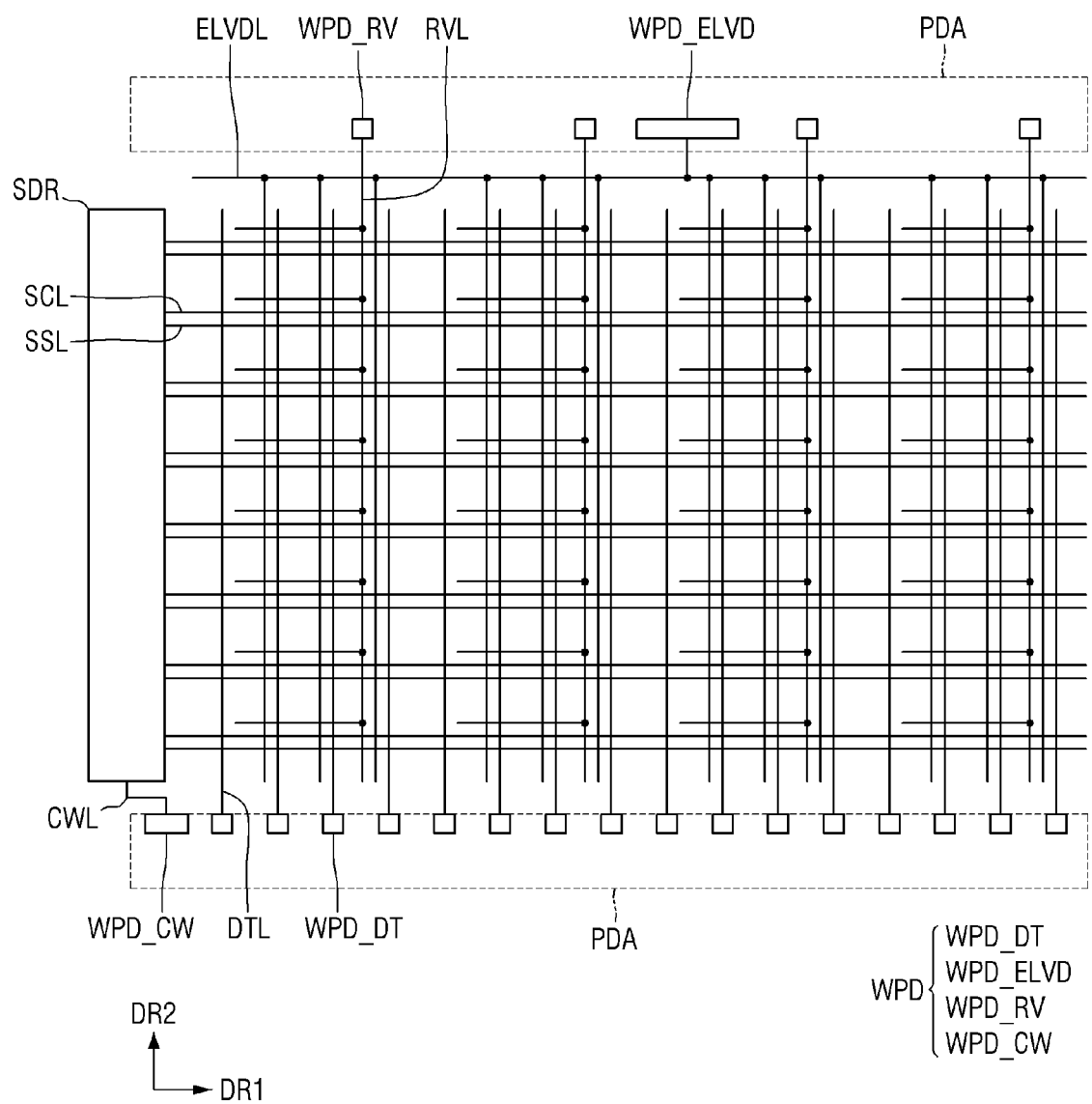
FIG. 2 is a schematic plan view illustrating a circuit of a first substrate of the display device according to an embodiment.

FIG. 2 is a schematic plan view illustrating a circuit of a first substrate of the display device according to an embodiment.

Referring to FIG. 2, in an embodiment, a plurality of wirings are disposed on the first substrate. The wirings may include a scan line SCL, a sensing signal line SSL, a data line DTL, a reference voltage line RVL, a first power line ELVDL, and the like.

The scan line SCL and the sensing signal line SSL may extend in a first direction DR1. The scan line SCL and the sensing signal line SSL may be connected to the scan driver SDR. The scan driver SDR may include a driving circuit formed of or defined by the circuit layer. The scan driver SDR may be disposed in the third non-display area NDA on the first substrate, but the disclosure is not limited thereto. The scan driver SDR may be disposed in a fourth non-display area NDA or may be disposed in both the third and fourth non-display areas NDA. The scan driver SDR is connected to a signal connection wiring CWL, and at least one end portion of the signal connection wiring CWL may form or define a pad WPD_CW on the first non-display area NDA and/or the second non-display area NDA which may be connected to the external devices (EXD in FIG. 1A).

The data line DTL and the reference voltage line RVL may extend in a second direction DR2 crossing the first direction DR1. The first power line ELVDL may include portions extending in the second direction DR2. The first power line ELVDL may further include a portion extending in the first direction DR1. The first power line ELVDL may have a mesh structure, but the disclosure is not limited thereto.

At least one end portions of the data line DTL, the reference voltage line RVL, and the first power line ELVDL may define or connected to wiring pads WPD. Each wiring pad WPD may be disposed in a pad portion PDA of the non-display area NDA. In an embodiment, a wiring pad WPD_DT of the data line DTL (hereinafter, referred to as "data pad") may be disposed in the pad portion PDA of the first non-display area NDA. A wiring pad WPD_RV of the reference voltage line RVL (hereinafter referred to as "reference voltage pad") and a wiring pad WPD_ELVD of the first power line ELVDL (hereinafter referred to as "first power pad") may be disposed in the second non-display area NDA. In an alternative embodiment, the data pad WPD_DT, the reference voltage pad WPD_RV, and the first power pad WPD_ELVD may all be disposed in a same area, e.g., the first non-display area NDA. In an embodiment, as described above, the external devices ('EXD' in FIG. 1A) may be disposed or mounted on the wiring pads WPD. The external devices EXD may be disposed or mounted on the wiring pads WPD by applying an anisotropic conductive film, ultrasonic bonding or the like.

Each pixel PX on the first substrate includes a pixel driving circuit. The above-described wirings may extend or pass through each pixel PX or the periphery thereof to apply a driving signal to each pixel driving circuit. The pixel driving circuit may include a transistor and a capacitor. The number of the transistor and the capacitor of each pixel driving circuit may be variously modified. Hereinafter, an embodiment of the pixel driving circuit having a 3T1C structure including three transistors and one capacitor will be described in detail. However, the disclosure is not limited thereto, and other modified pixel PX structures such as a 2T1C structure, a 7T1C structure, and a 6T1C structure may be adopted.

Figure 3:
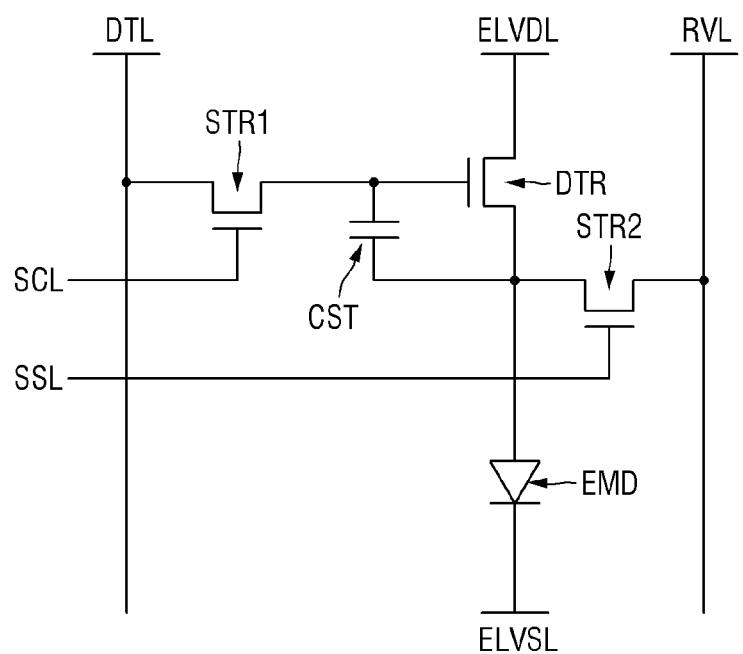
FIG. 3 is an equivalent circuit diagram of one pixel of a display device according to an embodiment.

FIG. 3 is an equivalent circuit diagram of one pixel of a display device according to an embodiment.

Referring to FIG. 3, an embodiment of a pixel PX of the display device includes three transistors DTR, STR1 and STR2 and one storage capacitor CST in addition to a light emitting element EMD.

The light emitting element EMD emits light corresponding to a current supplied through a driving transistor DTR. The light emitting element EMD may be implemented as an organic light emitting diode ("OLED"), a micro light emitting diode, a nano light emitting diode or the like.

A first electrode (i.e., anode electrode) of the light emitting element EMD is connected to a source electrode of the driving transistor DTR, and a second electrode (i.e., cathode electrode) of the light emitting element EMD is connected to a second power line ELVSL to which a low potential voltage (second source voltage) lower than a high potential voltage (first source voltage) of the first power line ELVDL is supplied.

The driving transistor DTR adjusts a current flowing from the first power line ELVDL, to which the first source voltage is applied, to the light emitting element EMD based on a voltage difference between a gate electrode and the source electrode. The gate electrode of the driving transistor DTR may be connected to a first source/drain electrode of the first switching transistor STR1, the source electrode of the driving transistor DTR may be connected to the first electrode of the light emitting element EMD, and a drain electrode of the driving transistor DTR may be connected the first power line ELVDL to which the first source voltage is applied.

The first switching transistor STR1 is turned on by a scan signal applied from the scan line SCL to connect the data line DTL to the gate electrode of the driving transistor DTR. A gate electrode of the first switching transistor STR1 may be connected to the scan line SCL, the first source/drain electrode of the first switching transistor STR1 may be connected to the gate electrode of the driving transistor DTR, and a second source/drain electrode of the first switching transistor STR1 may be connected to the data line DTL.

The second switching transistor STR2 is turned on by a sensing signal applied from the sensing signal line SSL to connect the reference voltage line RVL to the source electrode of the driving transistor DTR. A gate electrode of the second switching transistor STR2 may be connected to the sensing signal line SSL, the first source/drain electrode of the second switching transistor STR2 may be connected to the reference voltage line RVL, and the second source/drain electrode of the second switching transistor STR2 may be connected to the source electrode of the driving transistor DTR.

In an embodiment, the first source/drain electrode of each of the first and second switching transistors STR1 and STR2 may be a source electrode, and the second source/drain electrode of each of the first and second switching transistors STR1 and STR2 may be a drain electrode. However, the disclosure is not limited thereto, and alternatively, the first source/drain electrode of each of the first and second switching transistors STR1 and STR2 may be a drain electrode, and the second source/drain electrode of each of the first and second switching transistors STR1 and STR2 may be a source electrode.

The capacitor CST is connected between the gate electrode and the source electrode of the driving transistor DTR. The storage capacitor CST stores a difference voltage between a gate voltage and a source voltage of the driving transistor DTR.

The driving transistor DTR, the first switching transistor STR1, and the second switching transistor STR2 may be formed as or defined by thin film transistors. In an embodiment, the driving transistor DTR, the first switching transistor STR1, and the second switching transistor STR2 may be N-type metal oxide semiconductor field effect transistors ("MOSFET"s), but the disclosure is not limited thereto. Alternatively, the driving transistor DTR, the first switching transistor STR1, and the second switching transistor STR2 may be P-type MOSFETs, or some of the driving transistor DTR, the first switching transistor STR1, and the second switching transistor STR2 may be N-type MOSFETs, while others may be P-type MOSFETs.

Figure 4:
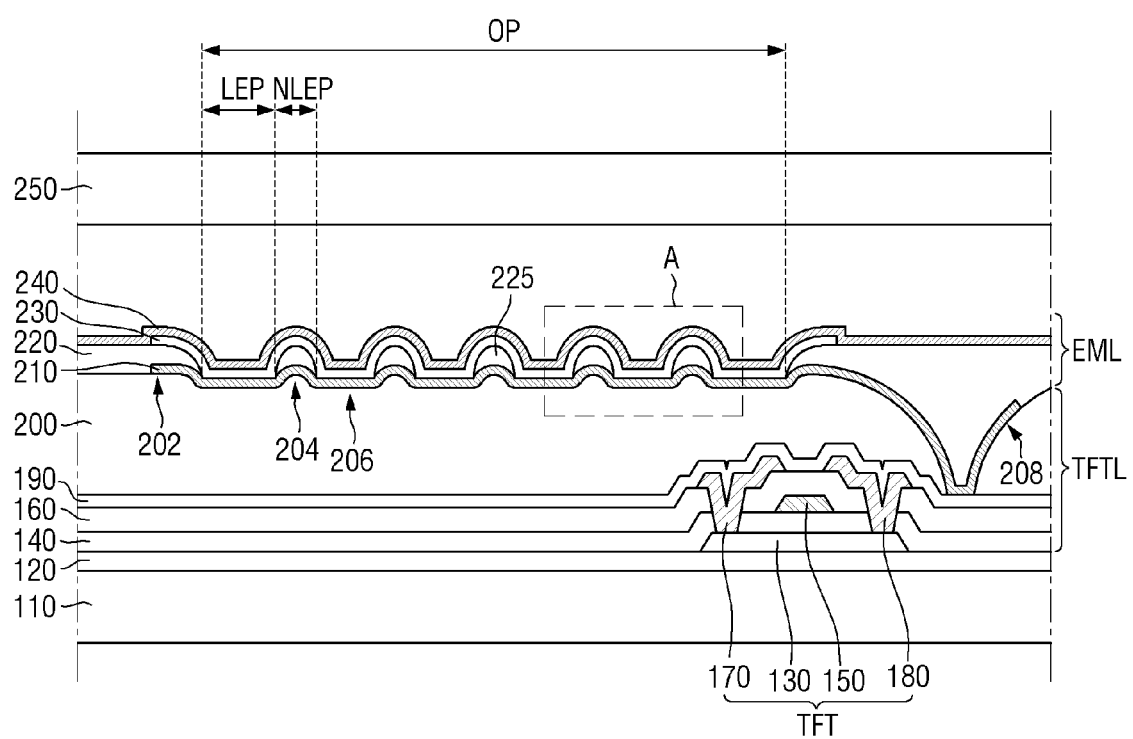
FIG. 4 is a cross-sectional view illustrating one pixel of a display device according to an embodiment.
Figure 5:
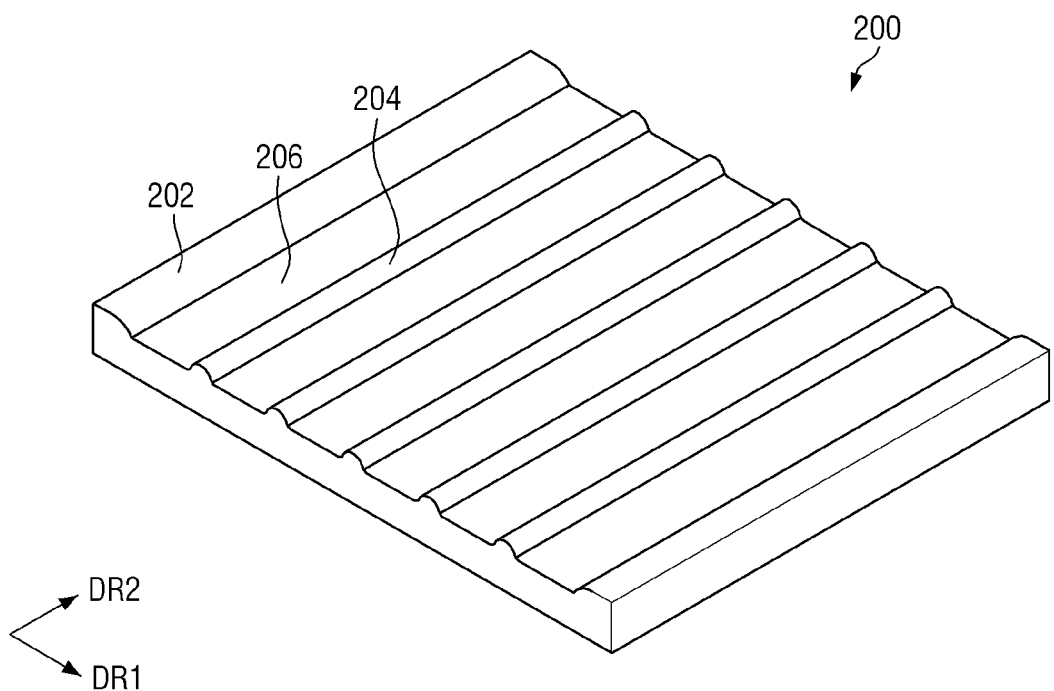
FIG. 5 is a perspective view schematically showing a planarization layer according to an embodiment.
Figure 6:
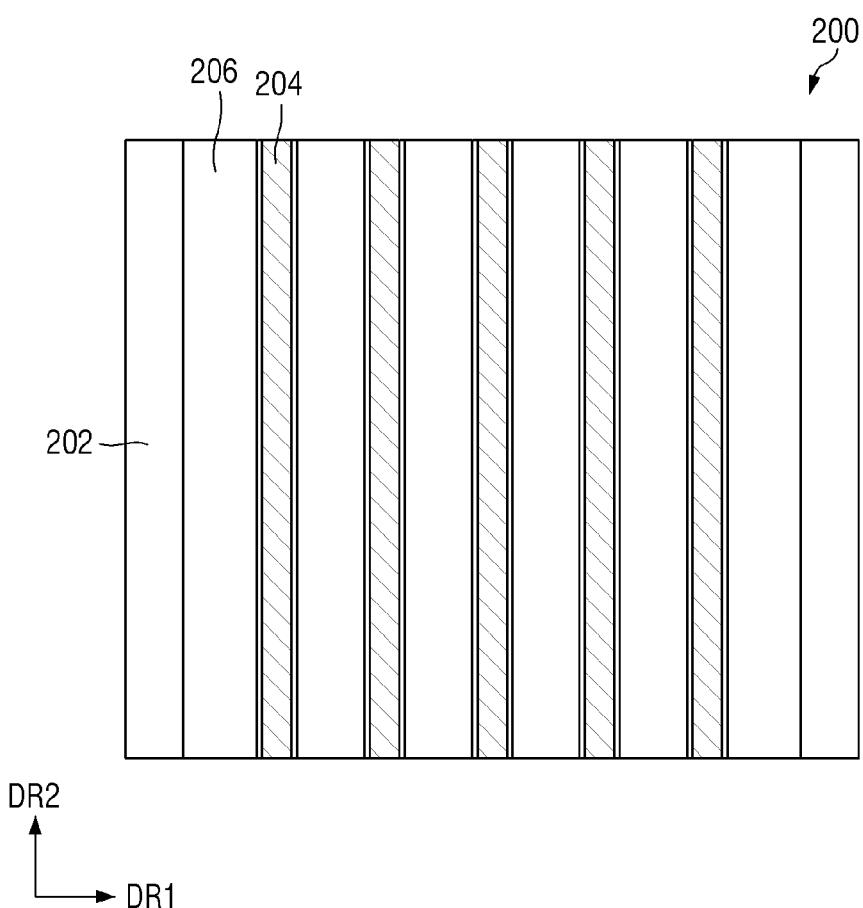
FIG. 6 is a plan view schematically showing a planarization layer according to an embodiment.
Figure 7:
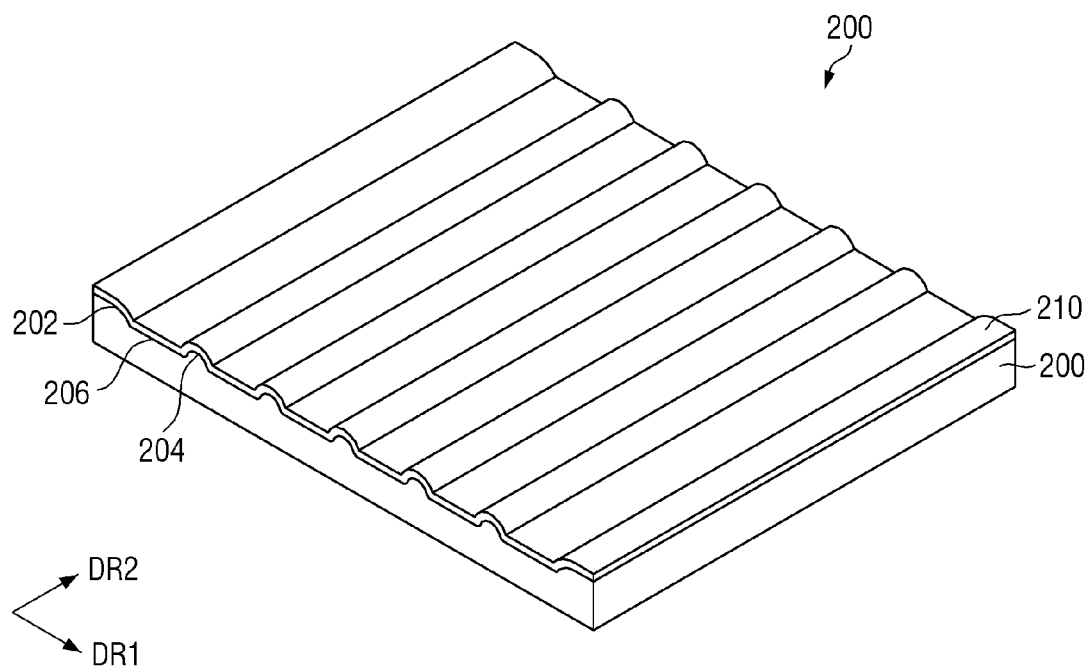
FIG. 7 is a perspective view schematically showing a planarization layer and a first electrode according to an embodiment.
Figure 8:
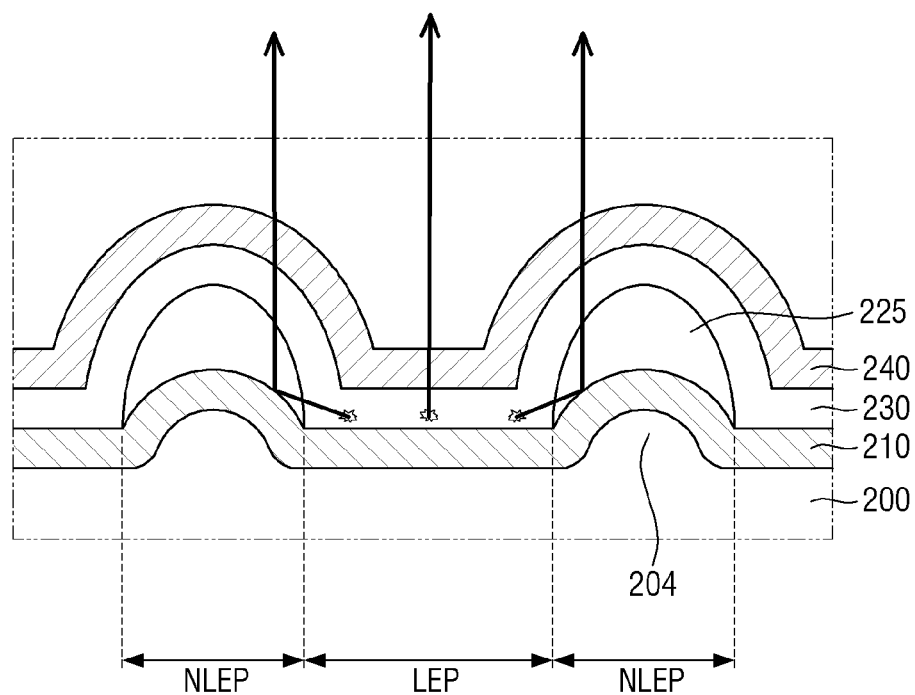
FIG. 8 is an enlarged view schematically showing area A of FIG. 4.
Figure 9:
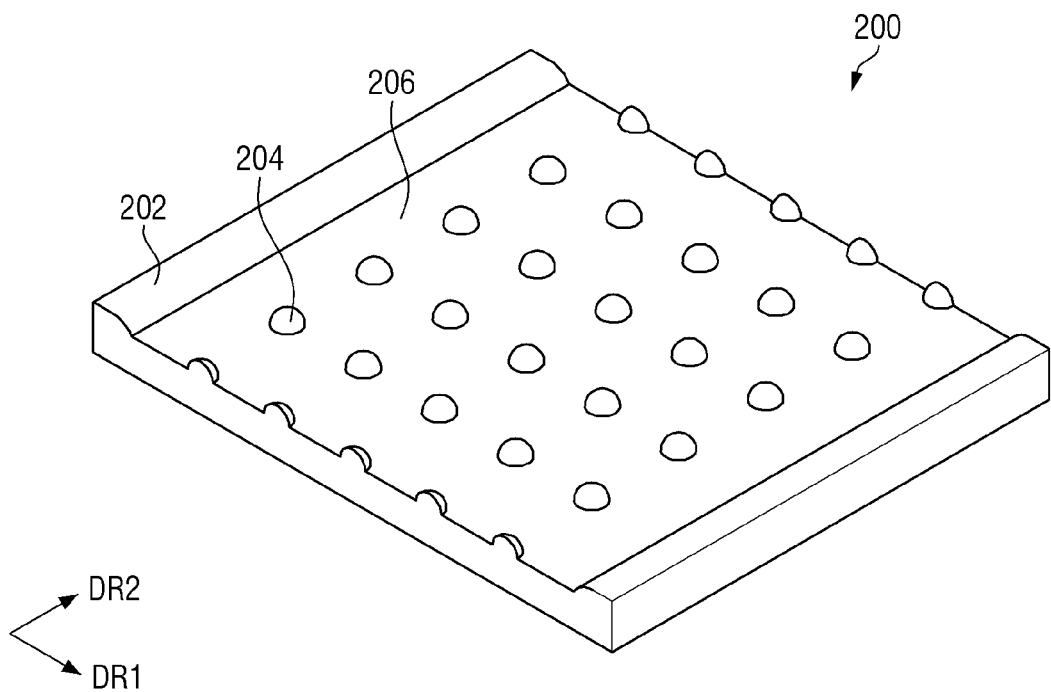
FIG. 9 is a perspective view schematically showing an alternative embodiment of a planarization layer.
Figure 10:
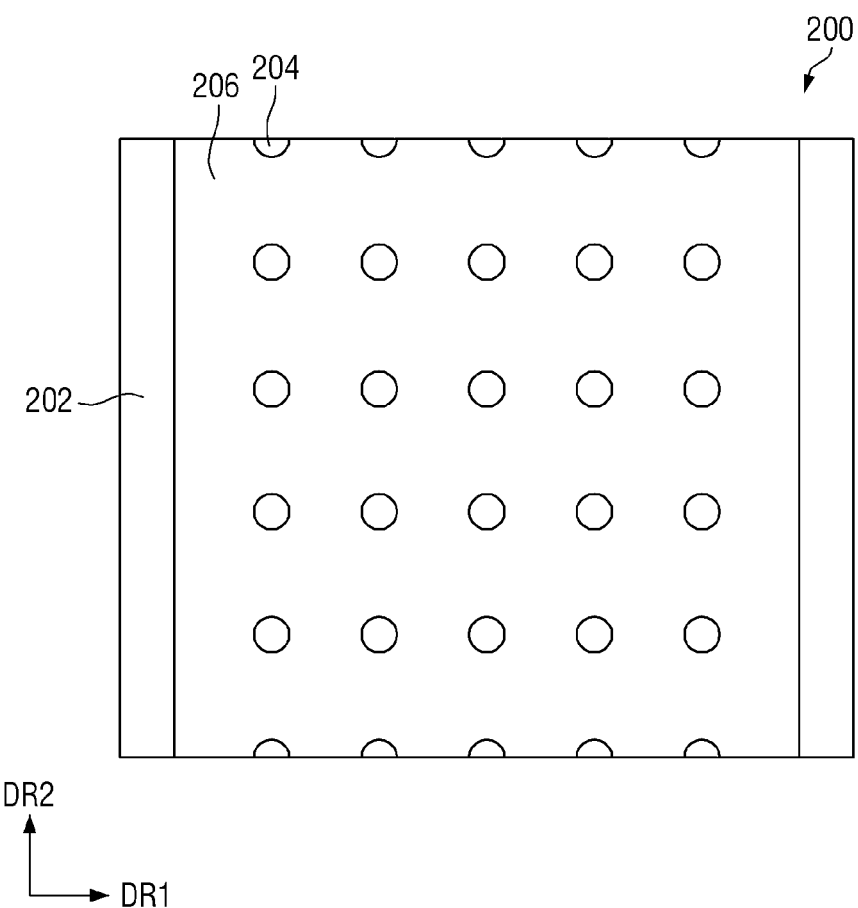
FIG. 10 is a plan view schematically showing the planarization layer of FIG. 9.

FIG. 4 is a cross-sectional view illustrating one pixel of a display device according to an embodiment. FIG. 5 is a perspective view schematically showing a planarization layer according to an embodiment. FIG. 6 is a plan view schematically showing a planarization layer according to an embodiment. FIG. 7 is a perspective view schematically showing a planarization layer and a first electrode according to an embodiment. FIG. 8 is an enlarged view schematically showing area A of FIG. 4. FIG. 9 is a perspective view schematically showing a planarization layer according to an alternative embodiment. FIG. 10 is a plan view schematically showing the planarization layer of FIG. 9.

FIG. 4 illustrates an embodiment of a display device of a top emission type in which light L is emitted in an opposite direction (toward a second substrate 250) rather than a direction toward a first substrate 110 on which a light emitting element layer EML is disposed.

Referring to FIG. 4, an embodiment of the display device 1 may include the first substrate 110, a thin film transistor layer TFTL and the light emitting element layer EML disposed on the first substrate 110, and a second substrate 250 facing the first substrate 110.

The first substrate 110 may be a rigid substrate or a flexible substrate which may be bent, folded or rolled. The first substrate 110 may include or be made of an insulating material such as glass, quartz, or polymer resin. In one embodiment, the first substrate 110 may include a polymeric material including at least one selected from polyethersulphone ("PES"), polyacrylate ("PA"), polyarylate ("PAR"), polyetherimide ("PEI"), polyethylene naphthalate ("PEN"), polyethylene terephthalate ("PET"), polyphenylene sulfide ("PPS"), polyallylate, polyimide ("PI"), polycarbonate ("PC"), cellulose triacetate ("CAT"), cellulose acetate propionate ("CAP"), and a combination thereof. In an embodiment, the first substrate 110 may include a metal material.

The thin film transistor layer TFTL may be disposed on the first substrate 110. The thin film transistor layer TFTL may include a thin film transistor TFT, a gate insulating layer 140, an interlayer insulating layer 160, a passivation layer 190, and a planarization layer 200.

A buffer layer 120 may be disposed on the first substrate 110. The buffer layer 120 may be disposed on the first substrate 110 to protect the thin film transistor TFT and the light emitting element EMD from moisture penetrating through the first substrate 110 susceptible to moisture permeation. The buffer layer 120 may include a plurality of inorganic layers alternately stacked one on another. In one embodiment, for example, the buffer layer 120 may have a multilayer structure in which one or more inorganic layers of silicon oxide (SiOx), silicon nitride (SiNx), and silicon oxynitride (SiOxNy) are alternately stacked. However, the disclosure is not limited thereto, and alternatively, the buffer layer 120 may be omitted.

The thin film transistor TFT may be disposed on the buffer layer 120. The thin film transistor TFT may include an active layer 130, a gate electrode 150, a source electrode 170, and a drain electrode 180. FIG. 4 illustrates an embodiment where the thin film transistor TFT is formed by a top gate method in which the gate electrode 150 is located above the active layer 130, the disclosure is not limited thereto. Alternatively, the thin film transistor TFT may be formed by a bottom gate method in which the gate electrode 150 is located below the active layer 130, or a double gate method in which the gate electrode 150 is located both above and below the active layer 130.

The active layer 130 may be disposed on the buffer layer 120. The active layer 130 may include polycrystalline silicon, monocrystalline silicon, an oxide semiconductor, or the like. In an embodiment where the semiconductor layer includes an oxide semiconductor, the active layer 130 may include a plurality of conductive regions and a channel region therebetween. The oxide semiconductor may be an oxide semiconductor containing indium (In). In one embodiment, for example, the oxide semiconductor may be indium tin oxide ("ITO"), indium zinc oxide ("IZO"), indium gallium oxide ("IGO"), indium zinc tin oxide ("IZTO"), indium gallium tin oxide ("IGTO"), indium gallium zinc tin oxide ("IGZTO") or the like.

In an alternative embodiment, the active layer 130 may include polycrystalline silicon. The polycrystalline silicon may be formed by crystallizing amorphous silicon. In such an embodiment, the conductive regions of the active layer 130 may be regions doped with impurities.

A light blocking layer for blocking external light incident on the active layer 130 may be further disposed between the buffer layer 120 and the active layer 130. In such an embodiment, the light blocking layer may be disposed to overlap the active layer 130 and may include or be formed of an opaque metal material that blocks light transmission.

The gate insulating layer 140 may be disposed on the active layer 130. The gate insulating layer 140 may include the active layer 130 and may be disposed on the buffer layer 120. The gate insulating layer 140 may include or be formed of an inorganic layer including an inorganic material, such as silicon oxide (SiOx), silicon nitride (SiNx) or silicon oxynitride (SiOxNy), or a stacked structure thereof.

The gate electrode 150 may be disposed on the gate insulating layer 140. A gate line and one electrode of the storage capacitor may be further disposed on the same layer as the gate electrode 150. The gate electrode 150 may be disposed to overlap the active layer 130 in the thickness direction. The gate electrode 150 may have a single layer structure or a multilayer structure, in which each layer includes or is made of at least one selected from molybdenum (Mo), aluminum (Al), chromium (Cr), gold (Au), titanium (Ti), nickel (Ni), neodymium (Nd) and copper (Cu) and an alloy thereof. However, the disclosure is not limited thereto.

The interlayer insulating layer 160 may be disposed on the gate electrode 150. The interlayer insulating layer 160 may function as an insulating layer between the gate electrode 150 and other layers disposed thereon. In such an embodiment, the interlayer insulating layer 160 may be disposed to cover the gate electrode 150 and function to protect the gate electrode 150. The interlayer insulating layer 160 may include or be formed of an inorganic layer including an inorganic material, such as silicon oxide (SiOx), silicon nitride (SiNx) or silicon oxynitride (SiOxNy), or a stacked structure thereof.

The source electrode 170 and the drain electrode 180 may be disposed on the interlayer insulating layer 160. Each of the source electrode 170 and the drain electrode 180 may be connected to the active layer 130 via contact holes passing through the gate insulating layer 140 and the interlayer insulating layer 160. The source electrode 170 and the drain electrode 180 may have a single layer structure or a multilayer structure, in which each layer includes or is made of at least one selected from molybdenum (Mo), aluminum (Al), chromium (Cr), gold (Au), titanium (Ti), nickel (Ni), neodymium (Nd) and copper (Cu) and an alloy thereof. However, the disclosure is not limited thereto. Accordingly, the thin film transistor TFT including the active layer 130, the gate electrode 150, the source electrode 170, and the drain electrode 180 may be disposed on the buffer layer 120 as described above.

The passivation layer 190 for insulating the thin film transistor TFT may be disposed on the source electrode 170 and the drain electrode 180. The passivation layer 190 may function as an insulating layer between the source electrode 170 and the drain electrode 180 and other layers disposed thereon. The passivation layer 190 may include or be formed of an inorganic layer including an inorganic material, such as silicon oxide (SiOx), silicon nitride (SiNx) or silicon oxynitride (SiOxNy), or a stacked structure thereof.

The planarization layer 200 for planarizing a step structure due to the thin film transistor TFT may be disposed on the passivation layer 190. The planarization layer 200 may include a via hole 208 through which the first electrode 210 is connected to the thin film transistor TFT. The via hole 208 may be defined or formed to overlap the thin film transistor TFT. The first electrode 210 may be connected to the drain electrode 180 of the thin film transistor TFT through the via hole 208. The planarization layer 200 may include an organic material such as acrylic resin, epoxy resin, phenolic resin, polyamide resin, and polyimide resin, and may perform a surface planarization function.

The light emitting element layer EML may be disposed on the planarization layer 200. The light emitting element layer EML may include light emitting elements and a pixel defining layer 220.

The light emitting elements and the pixel defining layer 220 may be disposed on the planarization layer 200. The light emitting element may be an organic light emitting element. In such an embodiment, the light emitting element may include a first electrode 210, a light emitting layer 230, and a second electrode 240.

The first electrode 210 may serve as a pixel electrode, and may be connected to the drain electrode 180 of the thin film transistor TFT through the via hole 208. The first electrode 210 may be an anode electrode and may be a reflective electrode. The first electrode 210 may include or be formed of a metal material, having high reflectivity, such as a stacked structure (Ti/Al/Ti) of aluminum (Al) and titanium (Ti), a stacked structure (ITO/Al/ITO) of Al and ITO, an APC alloy, a stacked structure (ITO/APC/ITO) of an APC alloy and ITO, or the like. The APC alloy is an alloy of silver (Ag), palladium (Pd) and copper (Cu).

The pixel defining layer 220 may be disposed on the planarization layer 200 to cover the edge of the first electrode 210 to partition the pixels. In an embodiment, an opening OP is defined through the pixel defining layer 220 to expose the first electrode 210 therebelow to define a pixel. The pixel defining layer 220 may include an organic material such as acrylic resin, epoxy resin, phenolic resin, polyamide resin, and polyimide resin, and may also perform a surface planarization function.

The light emitting layer 230 may be disposed on the first electrode 210 and the pixel defining layer 220. The light emitting layer 230 may be an organic light emitting layer. The light emitting layer 230 may emit one of red light, green light and blue light. Alternatively, the light emitting layer 230 may be a white light emitting layer that emits white light. In such an embodiment, the light emitting layer 230 may have a structure in which a red light emitting layer, a green light emitting layer, and a blue light emitting layer are stacked one on another, and may be a common layer formed commonly to the pixels. In such an embodiment, the display device 1 may further include a separate color filter for displaying a red, green or blue color.

The light emitting layer 230 may further include at least one selected from a hole injection layer, a hole transport layer, an electron transport layer, and an electron injection layer. In an embodiment, the light emitting layer 230 may be in a tandem structure of two or more stacks. In such an embodiment, a charge generating layer may be further disposed between the stacks.

The second electrode 240 may be disposed on the light emitting layer 230. The second electrode 240 may be disposed to cover the light emitting layer 230. The second electrode 240 may be a common layer formed commonly to the pixels. The second electrode 240 may include or be formed of a transparent conductive material ("TCO") such as ITO or IZO that may transmit light or a semi-transmissive conductive material such as magnesium (Mg), silver (Ag), or an alloy of Mg and Ag. In an embodiment where the second electrode 240 includes or is formed of a semi-transmissive conductive material, the light emission efficiency may be improved due to a micro-cavity effect.

In an embodiment, as described above, the first substrate 110 on which the thin film transistor layer TFTL and the light emitting element layer EML are disposed may be bonded to the second substrate 250 and sealed, thereby constituting the display device 1.

In an embodiment, the planarization layer 200 may include a plurality of first protrusions 202, a plurality of second protrusions 204, and a plurality of flat portions 206.

Referring to FIGS. 5 to 7 in conjunction with FIG. 4, the first protrusions 202 may serve to define a region in which the first electrode 210 is disposed, and provide an inclination such that light emitted from the light emitting layer 230 is reflected by the first electrode 210. The first protrusions 202 may occupy most of the planarization layer 200.

The second protrusions 204 may be disposed between the first protrusions 202, and may be disposed to be spaced apart from each other at a predetermined interval. The second protrusions 204 may serve to provide an inclination to the first electrode 210 disposed on the plurality of second protrusions 204 such that the light emitted from the light emitting layer is reflected by the first electrode 210 to be emitted upward.

The second protrusions 204 may include protrusions having a semicircular cross section. The second protrusions 204 may be disposed to extend in the second direction DR2 to have a stripe shape. In one embodiment, for example, the second protrusions 204 may be in a lenticular lens shape.

The number of the second protrusions 204 may be equal to or greater than that shown in the drawings. The number of the second protrusions 204 may be several to tens. The second protrusions 204 may have a predetermined width in the first direction DR1, and the width of the second protrusions 204 may be in a range of several hundreds of nanometers to several micrometers. In an embodiment, the second protrusions 204 may be spaced apart from each other at a predetermined interval, and the interval may be in a range of several hundreds of nanometers to several micrometers. The number of the second protrusions 204 may be determined based on the width and interval of the second protrusions 204, and the second protrusion 204 may be provided in plural according to the width of one sub-pixel.

The flat portion 206 may be disposed between the first protrusions 202 and the second protrusions 204 and between the second protrusions 204. The flat portion 206 may be a region having a flat surface disposed between the protrusions 202 and 204. The flat portion 206 may include an emission portion LEP in which the first electrode 210, the light emitting layer 230 and the second electrode 240 overlap each other to substantially emit light. The first electrode 210 disposed on the flat portion 206 may contact the light emitting layer 230 and the light emitting layer 230 may contact the second electrode 240 to emit light. In such an embodiment, in the emission portion LEP, the first electrode 210 may contact the light emitting layer 230 and the light emitting layer 230 may contact the second electrode 240.

The flat portions 206 may be spaced apart from each other while extending in the second direction DR2 in a same manner as the second protrusions 204. The width of the flat portion 206 may be equal to the interval of the second protrusions 204. The number of the flat portions 206 may be greater than the number of the second protrusions 204. In a plan view, the flat portions 206 may be formed in a stripe shape between the second protrusions 204. In an embodiment where the second protrusions 204 are formed in a shape of stripes in a plan view, the flat portion 206 may be disposed between the stripes.

The first protrusions 202 and the second protrusions 204 may each have a predetermined height. In one embodiment, for example, the first protrusions 202 and the second protrusions 204 are formed simultaneously by a same mask process, so that the first protrusions 202 and the second protrusions 204 may have a same height as each other. In an alternative embodiment, the first protrusions 202 and the second protrusions 204 may be formed to have different heights from each other by using a multi-tone mask. In such an embodiment, the height of the first protrusions 202 may be higher than the height of the second protrusions 204, or the height of the second protrusions 204 may be higher than the height of the first protrusions 202.

In an embodiment, as shown in FIG. 7, the first electrode 210 disposed on the planarization layer 200 may be disposed or formed unevenly along the surface of the planarization layer 200. In such an embodiment, the first electrode 210 may be disposed along the step coverage of the planarization layer 200. The first electrode 210 may be flat on the flat portion 206 of the planarization layer 200, and may be convex along the shape of the first and second protrusions 202 and 204 on the first and second protrusions 202 and 204 of the planarization layer 200. The first electrode 210 may have an inclined surface in contact with at least side surfaces of the first and second protrusions 202 and 204. As will be described later, the inclined surface of the first electrode 210 reflects light emitted from the light emitting layer 230 upward, thereby improving light emission efficiency and luminance.

The pixel defining layer 220 may include a plurality of insulating patterns 225 disposed on the first electrode 210 in the opening OP of the pixel defining layer 220. The insulating patterns 225 may define the emission portion LEP in the opening OP of the pixel defining layer 220.

Referring to FIG. 4, the insulating patterns 225 may be disposed to overlap the second protrusions 204 and to be spaced apart from each other at a predetermined interval. The insulating patterns 225 may completely cover the second protrusions 204. The insulating patterns 225 may cover the first electrode 210 disposed on the second protrusions 204. In some regions of the first electrode 210 disposed on the second protrusions 204, the first electrode 210 is bent such that an electric field is concentrated, or the upper portion of the first electrode 210 is not flat, which may cause a difference in light emission characteristics. In an embodiment, where the first electrode 210 overlapping the second protrusions 204 is covered with the insulating patterns 225, damage to the light emitting layer 230 due to concentration of an electric field may be effectively prevented, and non-uniformity in light emission characteristics may be effectively prevented.

The insulating patterns 225 may be disposed to extend in the second direction DR2 to have a stripe shape. In one embodiment, for example, the insulating patterns 225 may have a lenticular lens shape. The number of the insulating patterns 225 may be substantially the same as the number of the second protrusions 204. In one embodiment, for example, the number of the insulating patterns 225 may be several to tens. The insulating patterns 225 may have a predetermined width in the first direction DR1, and the predetermined width may be greater than the width of the second protrusion 204. The width of the insulating patterns 225 may be in a range of several hundreds of nanometers to several micrometers. In an embodiment, the insulating patterns 225 may be spaced apart from each other at a predetermined interval, and the predetermined interval may be greater than the width of the second protrusion 204. The interval of the insulating patterns 225 may be in a range of several hundreds of nanometers to several micrometers.

A region between the insulating patterns 225 may overlap the flat portion 206 of the planarization layer 200. The region between the insulating patterns 225 may be substantially defined as the emission portion LEP. In such an embodiment, the insulating patterns 225 may not overlap the flat portion 206 of the planarization layer 200. The insulating patterns 225 may be disposed between the first electrode 210 and the light emitting layer 230 to separate the first electrode 210 and the light emitting layer 230 from each other. Accordingly, the insulating patterns 225 may define a non-emission portion NLEP that does not emit light. In the non-emission portion NLEP, the first electrode 210 may contact the insulating patterns 225 and may not contact the light emitting layer 230.

The insulating patterns 225 may have a predetermined height, and may have a same height as the height of the pixel defining layer 220. In an embodiment, the pixel defining layer 220 and the insulating patterns 225 are simultaneously formed by a same mask process, so that the insulating patterns 225 and the pixel defining layer 220 may have a same height as each other. In an alternative embodiment, the insulating patterns 225 and the pixel defining layer 220 may be formed to have different heights from each other using a multi-tone mask. In such an embodiment, the height of the insulating patterns 225 may be higher than the height of the pixel defining layer 220, or the height of the insulating patterns 225 may be lower than the height of the pixel defining layer 220.

The light emitting layer 230 and the second electrode 240 may be unevenly disposed along the top surfaces of the first electrode 210 and the insulating patterns 225. In such an embodiment, since the light emitting layer 230 and the second electrode 240 are formed to be flat in a region overlapping the flat portion 206, the light emitting characteristics may be uniformly maintained.

In an embodiment, as described above, the insulating patterns 225 may define the non-emission portion NLEP, and a region between the insulating patterns 225, that is, a region not overlapping the insulating patterns 225, may define the emission portion LEP. The non-emission portion NLEP may be a region in which the second protrusions 204, the first electrode 210, the insulating patterns 225, the light emitting layer 230, and the second electrode 240 overlap each other. The emission portion LEP may be a region in which the flat portions 206, the first electrode 210, the light emitting layer 230, and the second electrode 240 overlap each other.

In an embodiment, the planar area of the second protrusions 204 in the opening OP of the pixel defining layer 220 may be equal to or less than the planar area of the flat portions 206 in the opening OP. In one embodiment, for example, in the opening OP of the pixel defining layer 220, the planar area of the second protrusions 204 may be in a range of about 40% to about 100% of the planar area of the flat portions 206. If the planar area of the second protrusions 204 is equal to or greater than about 40% of the planar area of the flat portions 206, the area reflecting light may increase due to the inclined first electrode 210, thereby improving light emission efficiency and luminance. If the planar area of the second protrusions 204 is equal to or less than about 100% of the planar area of the flat portions 206, the area of the emission portion LEP may decrease, thereby preventing a decrease in light emission efficiency.

Referring to FIG. 8, light emitted from the light emitting layer 230 may travel in all directions. Light emitted downward from the light emitting layer 230 may be reflected by the first electrode 210, which is a reflective electrode, and may proceed upward. Light emitted laterally from the light emitting layer 230 may be reflected from the inclined first electrode 210 by the second protrusions 204 and may proceed upward. Accordingly, light emitted from the light emitting layer 230 may be collected and emitted upward, thereby improving luminous efficiency and luminance.

FIGS. 9 and 10 show an embodiment having a same cross-sectional stacked structure as that of FIG. 4, and thus, any repetitive detailed description of the same or like elements as those in FIG. 4 will be omitted and the shape of the second protrusions 204 will be mainly described.

In an embodiment, as shown in FIG. 10, the planarization layer 200 may have a plurality of second protrusions 204 formed in a dot shape in a plan view. In one embodiment, for example, the second protrusions 204 may have a hemispherical shape. A region between the second protrusions 204, i.e., the remaining region on the first electrode 210 except for the second protrusions 204, may be the flat portion 206 of the planarization layer 200. The dot-shaped second protrusions 204 may be arranged at a predetermined interval with a predetermined width, and a predetermined number of the second protrusions 204 may be disposed. The width, interval, and number of the second protrusions 204 may be substantially the same as those of the second protrusions 204 described above.

In an embodiment, where the second protrusions 204 have a dot shape, the planar area of the emission portion LEP may be relatively larger than the planar area of the non-emission portion NLEP, when compared with the embodiments described above with reference to FIG. 5. In such an embodiment, the number of the second protrusions 204 is increased, such that the area of the side surfaces of the second protrusions 204 may be relatively increased, when compared with the embodiments described above with reference to FIG. 5. Accordingly, the inclined area of the first electrode 210 disposed on the side surfaces of the second protrusions 204 may be also increased, thereby further improving the light emission efficiency and luminance of the pixel.

Figure 11:
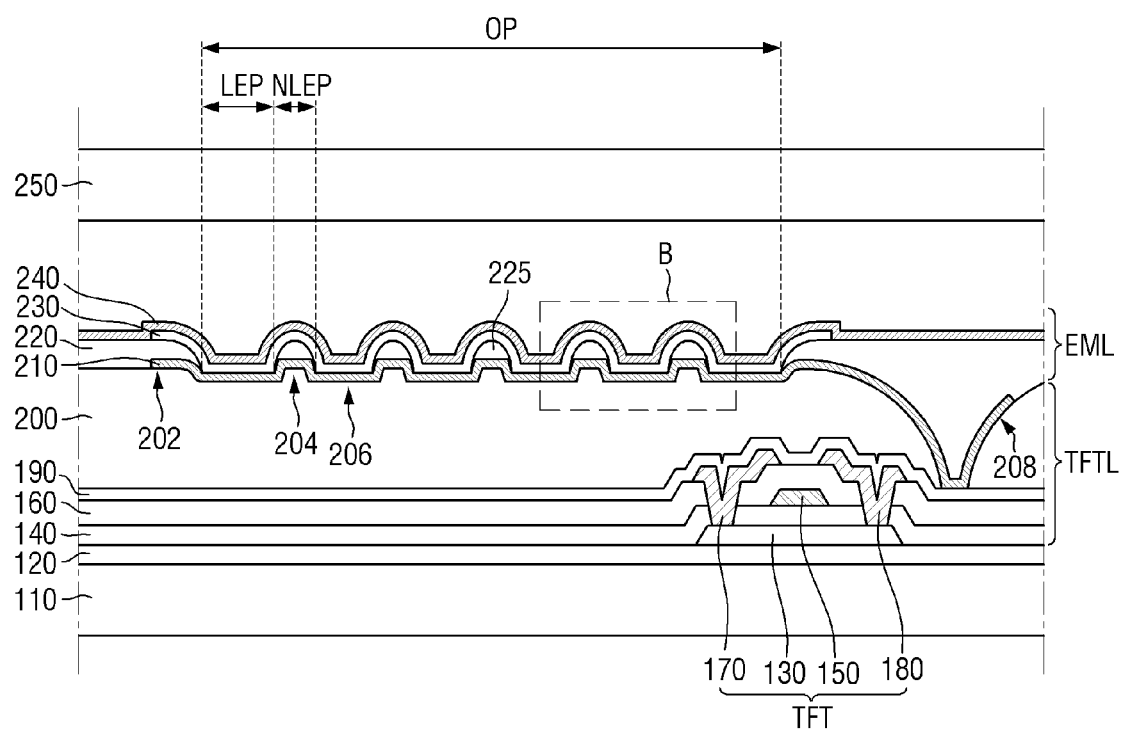
FIG. 11 is a cross-sectional view illustrating one pixel of a display device according to an alternative embodiment.
Figure 12:
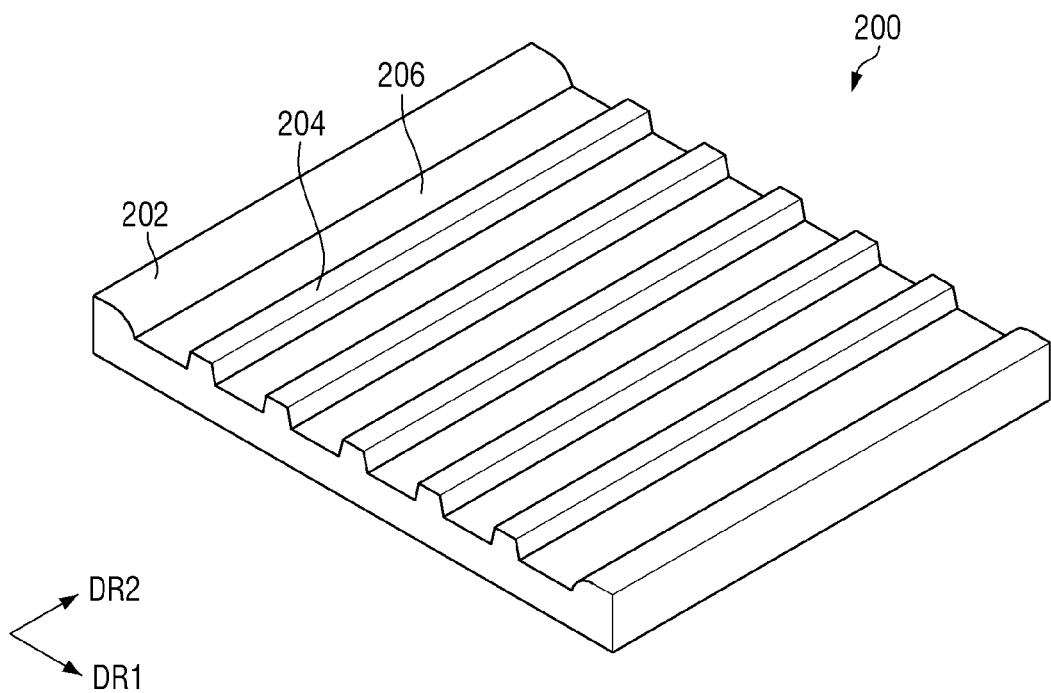
FIG. 12 is a perspective view schematically showing a planarization layer according to an embodiment.
Figure 13:
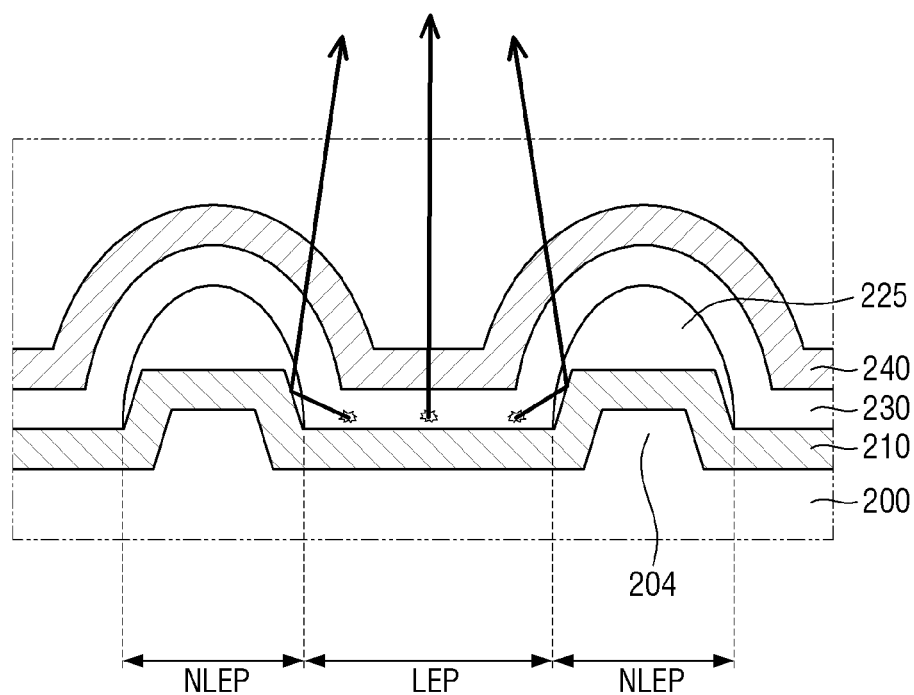
FIG. 13 is an enlarged view schematically showing area B of FIG. 11.
Figure 14:
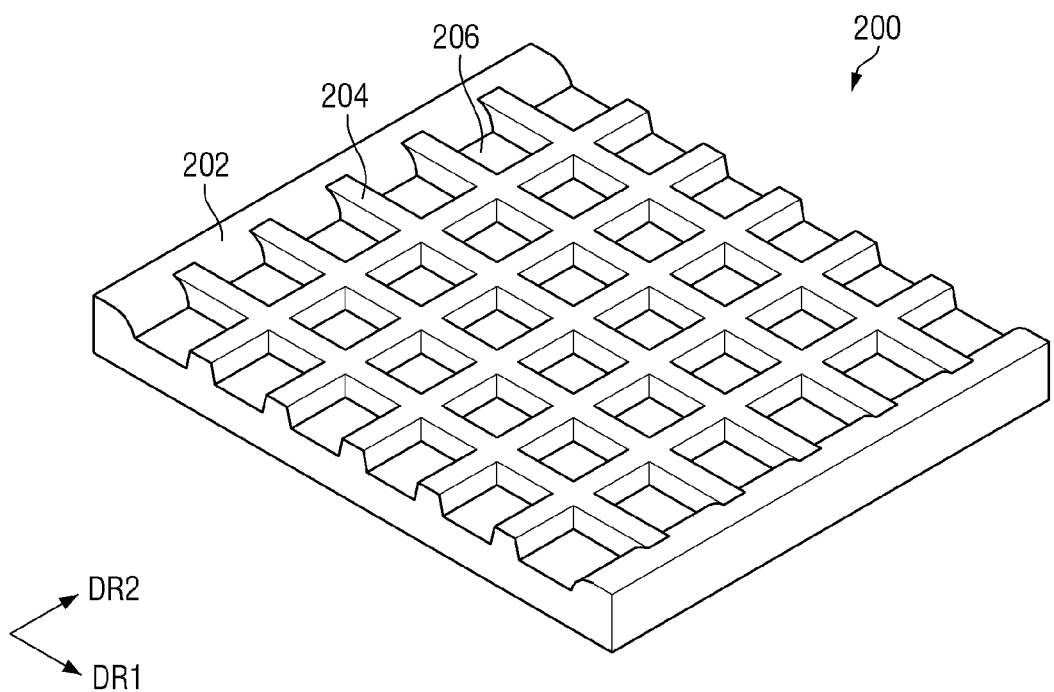
FIG. 14 is a perspective view schematically showing an alternative embodiment of a planarization layer.
Figure 15:
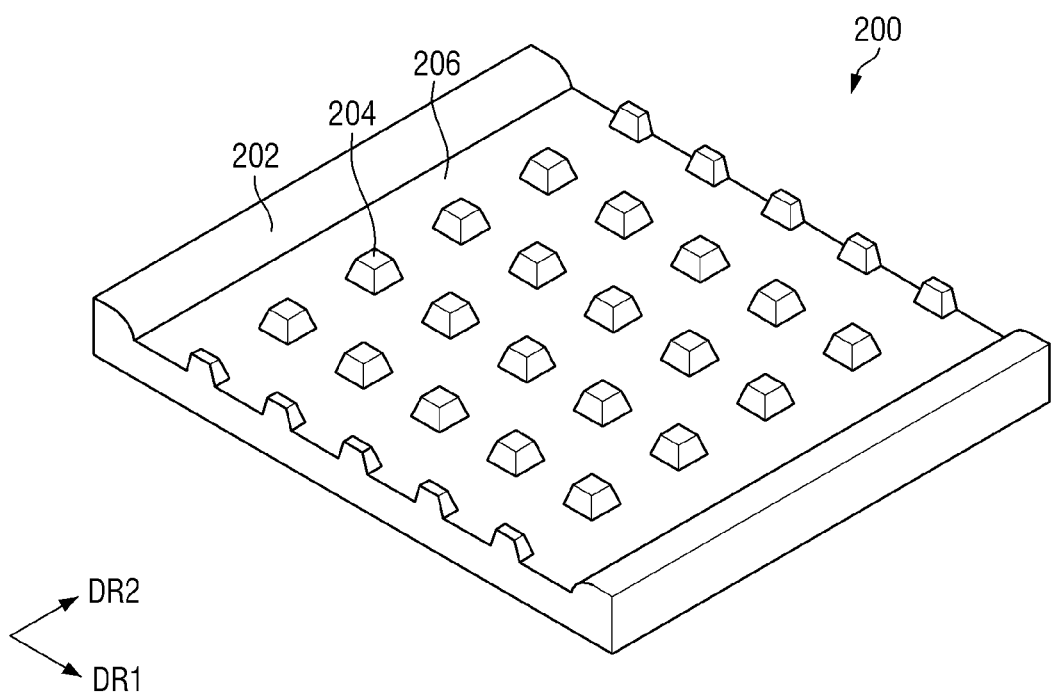
FIG. 15 is a perspective view schematically showing another alternative embodiment of a planarization layer.
Figure 16:
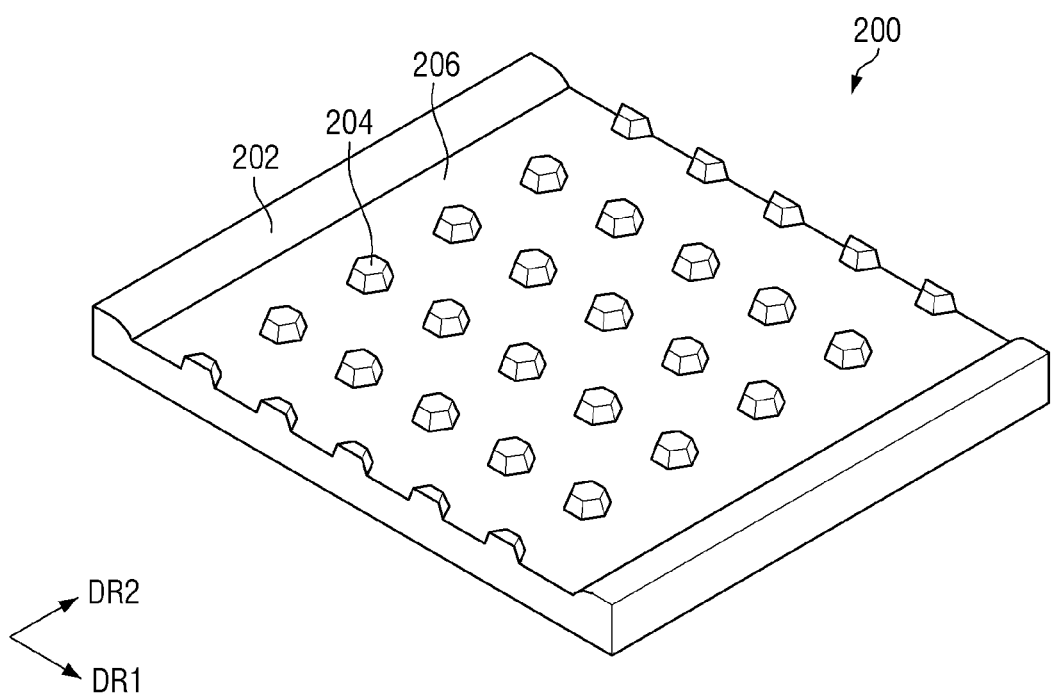
FIG. 16 is a perspective view schematically showing still another alternative embodiment of a planarization layer.
Figure 17:
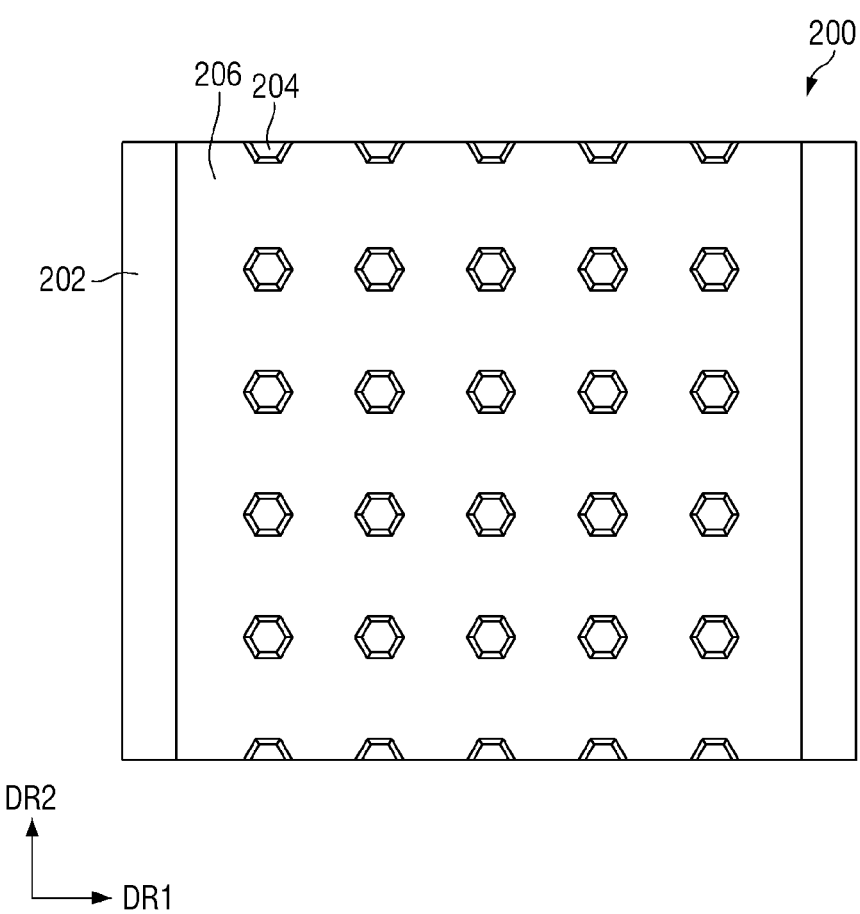
FIG. 17 is a plan view schematically showing still another alternative embodiment of a planarization layer.

FIG. 11 is a cross-sectional view illustrating one pixel of a display device according to an alternative embodiment. FIG. 12 is a perspective view schematically showing a planarization layer according to an embodiment. FIG. 13 is an enlarged view schematically showing area B of FIG. 11. FIG. 14 is a perspective view schematically showing another alternative embodiment of a planarization layer. FIG. 15 is a perspective view schematically showing still another alternative embodiment of a planarization layer. FIG. 16 is a perspective view schematically showing still another alternative embodiment of a planarization layer. FIG. 17 is a plan view schematically showing still another alternative embodiment of a planarization layer.

Referring to FIGS. 11 and 12, in an alternative embodiment of a display device 1 according to the invention, the planarization layer 200 may include a plurality of first protrusions 202, a plurality of second protrusions 204, and a plurality of flat portions 206.

The embodiment of FIGS. 11 and 12 is substantially the same as the embodiment of FIGS. 4 to 10 except that the cross section of the protrusions 204 is formed in a polygonal shape. Hereinafter, any repetitive detailed description of the same or like components as those described above with reference to FIGS. 4 to 10 will be omitted, and different components will be mainly described in detail.

Referring to FIGS. 11 to 13, in an embodiment, the second protrusions 204 may be disposed between the first protrusions 202, and may be spaced apart from each other at a predetermined interval. The second protrusions 204 may include protrusions having a polygonal cross section. Here, the polygon may a polygon whose sides have a positive angle less than 90 degrees. In one embodiment, for example, the second protrusions 204 may have a trapezoidal cross section. In such an embodiment, where the second protrusions 204 have a trapezoidal cross section, the sides of the trapezoid may have a positive angle, and light emitted from the light emitting layer 230 may be reflected upward, i.e., in the second direction DR2, thereby improving light emission efficiency and luminance. The second protrusions 204 may extend in the second direction DR2 and may have a bar shape having a trapezoidal cross section.

The second protrusions 204 may have a predetermined width in the first direction DR1, and the width of the second protrusions 204 may mean a maximum width measured in the first direction DR1 in the cross section. In one embodiment, for example, when the cross section of the second protrusions 204 is a trapezoid, the width of the second protrusions 204 may be the width of the base of the trapezoid.

Referring to FIG. 13, light emitted from the light emitting layer 230 may travel in all directions. Light emitted downward from the light emitting layer 230 may be reflected by the first electrode 210, which is a reflective electrode, and may proceed upward. Light emitted laterally from the light emitting layer 230 may be reflected from the inclined first electrode 210 by the second protrusions 204 and may proceed upward. In such an embodiment, since the second protrusions 204 have side surfaces having a positive angle less than 90 degrees, the first electrode 210 may also have side surfaces having a positive angle less than 90 degrees. Accordingly, light emitted from the light emitting layer 230 may be effectively reflected upward, thereby improving light emission efficiency and luminance.

FIGS. 14 to 17 show embodiments having a same cross-sectional stacked structure as that of FIG. 11, and thus, any repetitive detailed description of the same or like elements as those of FIG. 11 will be omitted, and the shape of the second protrusions 204 will be mainly described.

Referring to FIG. 14, in the planarization layer 200, the second protrusions 204 may be in a mesh shape. The second protrusions 204 may extend in the first direction DR1 and the second direction DR2 to have a mesh shape. The second protrusion 204 extending in the first direction DR1 and the second protrusion 204 extending in the second direction DR2 may cross each other, and may have, for example, a crossing angle of 90 degrees. However, the disclosure is not limited thereto, and the crossing angle may be variously modified.

In such an embodiment where the second protrusions 204 are in a mesh shape, the area of the side surfaces of the second protrusions 204 may be relatively further increased when compared with the embodiment of FIG. 12. Accordingly, in such an embodiment, the inclined area of the first electrode 210 disposed on the side surfaces of the second protrusions 204 may be also increased, thereby improving the light emission efficiency and luminance of the pixel.

Referring to FIGS. 15 to 17, in alternative embodiments, the second protrusions 204 may be formed in a dot shape. The second protrusions 204 may have a polygonal cross-sectional shape and a polygonal planar shape. In one embodiment, for example, the second protrusions 204 may be a polygonal pillar shape whose side surfaces have a positive angle less than 90 degrees.

In such embodiments where the second protrusions 204 are arranged in a dot shape and have a polygonal cross-sectional shape and a polygonal planar shape, the planar area of the emission portion LEP may be relatively larger than the planar area of the non-emission portion NLEP when compared with the embodiment of FIG. 12 described above. In such embodiments, the number of the second protrusions 204 is increased, such that the area of the side surfaces of the second protrusions 204 may be relatively increased compared to the embodiment of FIG. 12. Accordingly, the inclined area of the first electrode 210 disposed on the side surfaces of the second protrusions 204 may be also increased, thereby improving the light emission efficiency and luminance of the pixel.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a plurality of pixels, each of the pixels comprising:
a first substrate on which a thin film transistor is disposed;
a planarization layer disposed on the first substrate, wherein the planarization layer includes a plurality of protrusions;
a first electrode disposed on the planarization layer;
a pixel defining layer disposed on the first electrode, wherein the pixel defining layer includes a plurality of insulating patterns corresponding to the protrusions;
a light emitting layer disposed on the first electrode and the pixel defining layer; and
a second electrode disposed on the light emitting layer,
wherein the first electrode overlaps the protrusions in a plan view,
wherein an entirety of the plurality of insulating patterns overlaps the light emitting layer, and
wherein each of the plurality of insulating patterns overlaps only one of the first electrodes.

2. The display device of claim 1, wherein, for at least one of the pixels,
an opening is defined through the pixel defining layer to expose the first electrode, and
the protrusions overlap the opening.

3. The display device of claim 2, wherein, for at least one of the pixels,
the protrusions are spaced apart from each other, and
the planarization layer further includes a flat portion disposed between the protrusions.

4. The display device of claim 3, wherein, for at least one of the pixels, the flat portion does not overlap the insulating patterns.

5. The display device of claim 3, wherein, for at least one of the pixels,
the first electrode and the light emitting layer are in contact with each other in the flat portion, and
the light emitting layer and the second electrode are in contact with each other in the flat portion.

6. The display device of claim 3, wherein, for at least one of the pixels, the protrusions have a stripe shape or a mesh shape in a plan view.

7. The display device of claim 6, wherein, for at least one of the pixels, the protrusions have a hemispherical cross section or a polygonal cross section.

8. The display device of claim 3, wherein, for at least one of the pixels,
the protrusions have a dot shape in a plan view, and
the remaining region of the planarization layer on the first electrode except for the protrusions is the flat portion.

9. The display device of claim 8, wherein, for at least one of the pixels, the protrusions have a circular shape or a polygonal shape in the plan view.

10. The display device of claim 3, wherein, for at least one of the pixels, a planar area of the protrusions is equal to or less than a planar area of the flat portion.

11. The display device of claim 10, wherein, for at least one of the pixels, the planar area of the protrusions is in a range of about 40% to about 100% of the planar area of the flat portion.

12. The display device of claim 2, wherein, for at least one of the pixels, the protrusions overlap the first electrode, the light emitting layer and the second electrode.

13. The display device of claim 2, wherein, for at least one of the pixels,
the insulating patterns are disposed in the opening, and
the insulating patterns are disposed between the first electrode and the light emitting layer.

14. A display device comprising:
a plurality of pixels, each of the pixels comprising:
a first substrate including an emission portion and a non-emission portion;
a planarization layer disposed on the first substrate, wherein the planarization layer includes a plurality of protrusions;
a first electrode disposed on the planarization layer;
a pixel defining layer disposed on the first electrode, wherein the pixel defining layer includes a plurality of insulating patterns corresponding to the protrusions;
a light emitting layer disposed on the first electrode and the pixel defining layer; and
a second electrode disposed on the light emitting layer,
wherein the first electrode, the protrusions, the insulating patterns, the light emitting layer, and the second electrode overlap the non-emission portion, and
wherein the first electrode overlaps the protrusions in a plan view,
wherein an entirety of the plurality of insulating patterns overlaps the light emitting layer, and
wherein each of the plurality of insulating patterns overlaps only one of the first electrodes.

15. The display device of claim 14, wherein, for at least one of the pixels,
an opening is defined through the pixel defining layer to expose the first electrode, and the protrusions include a first protrusion which does not overlap the opening and a second protrusion overlapping the opening.

16. The display device of claim 15, wherein, for at least one of the pixels, the planarization layer further includes a flat portion disposed between the first protrusion and the second protrusion and between the second protrusions, and the flat portion, the first electrode, the light emitting layer and the second electrode overlap the emission portion.

17. The display device of claim 16, wherein, for at least one of the pixels, the first electrode is in contact with the light emitting layer in the emission portion, and the first electrode is in contact with the insulating patterns in the non-emission portion.

18. The display device of claim 15, wherein, for at least one of the pixels, a height of the first protrusion is equal to a height of the second protrusion.

19. The display device of claim 14, wherein, for at least one of the pixels, a height of the insulating patterns is equal to a height of the pixel defining layer.

20. The display device of claim 14, each of the pixels further comprising:

a thin film transistor disposed on the first substrate, wherein the thin film transistor includes an active layer, a gate electrode, a source electrode, and a drain electrode.

* * * * *